(12) United States Patent
Hathaway et al.

(10) Patent No.: US 7,680,626 B2
(45) Date of Patent: *Mar. 16, 2010

(54) SYSTEM AND METHOD OF ANALYZING TIMING EFFECTS OF SPATIAL DISTRIBUTION IN CIRCUITS

(75) Inventors: David J. Hathaway, Underhill, VT (US); Jerry D. Hayes, Milton, VT (US); Anthony D. Polson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 86 days.

This patent is subject to a terminal disclaimer.

(21) Appl. No.: 11/754,625

(22) Filed: May 29, 2007

(65) Prior Publication Data
US 2007/0220345 A1   Sep. 20, 2007

Related U.S. Application Data

(63) Continuation of application No. 10/709,362, filed on Apr. 29, 2004, now Pat. No. 7,280,939.

(51) Int. Cl.
*G06F 11/30* (2006.01)
*G06F 9/45* (2006.01)

(52) U.S. Cl. .......................................... 702/182; 716/6

(58) Field of Classification Search ................. 702/182, 702/79, 89, 125, 176, 185, 81, 84, 183, 186; 716/4–6, 1; 703/19, 1, 4; 713/500, 503
See application file for complete search history.

(56) References Cited

U.S. PATENT DOCUMENTS

| | | | |
|---|---|---|---|
| 5,396,435 A * | 3/1995 | Ginetti ........................... | 716/6 |
| 5,508,937 A | 4/1996 | Abato et al. .................... | 716/6 |
| 5,726,902 A | 3/1998 | Mahmood et al. ............... | 716/6 |
| 5,771,375 A | 6/1998 | Mains .......................... | 713/503 |
| 5,944,834 A | 8/1999 | Hathaway .................... | 713/500 |
| 6,237,127 B1 | 5/2001 | Craven et al. .................. | 716/6 |
| 6,240,542 B1 | 5/2001 | Kapur ......................... | 716/12 |
| 6,442,741 B1 | 8/2002 | Schultz ......................... | 716/6 |

(Continued)

OTHER PUBLICATIONS

Devgan et al., Block-Based Static Timing Analysis With Uncertainty, ICCAD 2003, pp. 607-614.*

(Continued)

*Primary Examiner*—Edward R Cosimano
*Assistant Examiner*—Toan M Le
(74) *Attorney, Agent, or Firm*—Richard M. Kotulak; Greenblum & Bernstein P.L.C.

(57) ABSTRACT

Systems and methods are provided for analyzing the timing of circuits, including integrated circuits, by taking into account the location of cells or elements in the paths or logic cones of the circuit. In one embodiment, a bounding region may be defined around cells or elements of interest, and the size of the bounding region may be used to calculate a timing slack variation factor. The size of the bounding region may be adjusted to account for variability in timing delays. In other embodiments, centroids may be calculated using either the location or the delay-weighted location of elements or cells within the path or cone and the centroids used to calculate timing slack variation factor. The timing slack variation factors are used to calculate a new timing slack for the path or logic cone of the circuit.

31 Claims, 6 Drawing Sheets

U.S. PATENT DOCUMENTS

| | | | |
|---|---|---|---|
| 6,449,578 B1 | 9/2002 | McBride | 702/119 |
| 6,519,749 B1 | 2/2003 | Chao et al. | 716/9 |
| 6,536,024 B1 | 3/2003 | Hathaway | 716/6 |
| 6,553,550 B1 | 4/2003 | Menegay et al. | 716/6 |
| 6,622,290 B1 | 9/2003 | Ginetti et al. | 716/6 |
| 6,708,139 B2 | 3/2004 | Rearick et al. | 702/185 |
| 6,772,402 B2 | 8/2004 | Mortensen | 716/6 |
| 6,789,223 B2 | 9/2004 | Fetherson | 714/738 |
| 6,799,308 B2 | 9/2004 | You et al. | 716/6 |
| 6,807,509 B2 | 10/2004 | Bourdin et al. | 702/125 |
| 6,880,142 B2 | 4/2005 | Cui et al. | 716/6 |
| 6,886,152 B1 | 4/2005 | Kong | 716/6 |
| 6,975,979 B2 | 12/2005 | Akimoto et al. | 703/19 |
| 7,000,205 B2 | 2/2006 | Devgan et al. | 716/6 |
| 7,010,763 B2 | 3/2006 | Hathaway et al. | 716/2 |
| 7,089,143 B2 * | 8/2006 | Foreman et al. | 702/125 |
| 7,143,379 B2 | 11/2006 | Darsow et al. | 716/6 |
| 7,222,318 B2 * | 5/2007 | Srinivasan | 716/6 |
| 7,280,939 B2 * | 10/2007 | Hathaway et al. | 702/182 |
| 7,444,608 B2 * | 10/2008 | Foreman et al. | 716/6 |

OTHER PUBLICATIONS

"Statistical Timing for Parametric Yield of Digital Integrated Circuits". J.A.G. Jess et al., 2003, pp. 932-937.

Aseem Agarwal, et al., "Statistical Timing Analysis for Intra-Die Process Variations with Spatial Correlations," ICCAD '03, Nov. 11-13, 2003, pp. 900-907.

Michael Orshansky, et al., "Impact of Spatial Intrachip Gate Length Variability on the Performance of High-Speed Digital Circuits," IBEE Transactions on Computer-Aided Design of Integrated Circuits and Systems, vol. 21, No. 5, May 2002, pp. 544-553.

Devgan et al., "Blocked-Based Static Timing Analysis with Uncertainty", ICCAD 2003, pp. 607-614.

Liou et al., "False-Path-Aware Statistical Timing Analysis and Efficient Path Selection for Delay Testing and Timing Validation", DAC 2002, pp. 566-569.

Chang et al., "Statistical Timing Analysis Considering Spatial Correlations Using a Single Pert-Like Traversal", ICCAD 2003, pp. 621-625.

Liou, et al., "Modeling, Testing, and Analysis for Delay Defects and Noise Effects in Deep Submicron Devices", Jun. 2003, IEEE, Transactions on Computer-Aided Design of Integrated Circuits and Systems, vol. 22, No. 6, pp. 756-769.

Agarwal et al., "Statistical Delay Computation Considering Spatial Correlations", 2003, IEEE, pp. 271-276.

* cited by examiner

SYSTEM AND METHOD OF ANALYZING TIMING EFFECTS OF SPATIAL DISTRIBUTION IN CIRCUITS

CROSS-REFERENCE TO RELATED APPLICATIONS

The present application is a Continuation of U.S. patent application Ser. No. 10/709,362 filed Apr. 29, 2004, issued as U.S. Pat. No. 7,280,939 on Oct. 9, 2007, the disclosure of which is expressly incorporated by reference herein in its entirety.

BACKGROUND OF THE INVENTION

1. Field of the Invention

The invention generally relates to the timing analysis of circuits, and, more particularly to systems and methods for analyzing the timing effects of spatial distribution in circuits.

2. Description of Related Art

In circuit design, one signal may need to arrive at a particular point in a circuit path before another signal. For example, a signal representing a stable data value may need to arrive at a memory element (e.g., a flip-flop or latch) before the clock signal that stores the value in the memory element. Alternatively, a signal representing a change in a data value may need to arrive at a memory element after the clock signal that stored the last data value. Two paths along which signals propagate so as to arrive at a particular pair of points (e.g., clock and data pins of a flip-flop) in a defined relationship with one another, as in the examples above, are often referred to as racing paths. Each set of racing paths typically includes an early path and a late path. The comparison of a pair of early and late mode signals to determine whether a particular requirement on their relative arrival times is called a timing test. An early mode signal or arrival time is the earliest time at which the value on a net or at a point can change from its previous cycle stable value, and a late mode signal or arrival time is the latest time at which the value on a net or at a point can settle to its final stable value for the current cycle.

Static timing analysis (STA) is a tool used for verification of circuit design and analysis of circuit performance. STA uses delay models to evaluate the delay in circuit paths. Most delay models used for STA employ parameter distributions, for example, parameter distributions for gate length, to define circuit performance. Each parameter distribution is a statistical measure that defines the possible values for each parameter and the relative likelihood of obtaining those values.

Three types of distributions are typically defined. The first type of distribution describes the variance of the chip means and defines possible mean values for a parameter that may be applied systematically across the chip. The second type of distribution describes a local mean that varies across the chip and defines the possible variation of the parameter across the chip. The third distribution is centered around the "local" mean and describes all the random, non-chip-dependent and non-position-dependent variations of the parameter.

In most cases, the three factors defined by the parameter distributions (mean or average value of a parameter, local variation of a parameter, and random variation of a parameter) are considered together, and an engineer designing a circuit considers the best-case and worst-case variation in a parameter. Typically, this would be done by performing an analysis in which a single value for each parameter is chosen from the chip mean distribution (e.g., the fastest for a "fast chip analysis" or the slowest for a "slow chip analysis"). Within this analysis early mode timing values are determined using the "best-case" (fastest) values within the local mean and random component distributions, and late mode timing values are determined using the "worst-case" (slowest) values within the local mean and random component distributions. Because the engineer considers the worst-case variation in the local mean of a parameter, pessimistic estimates of the delay in a circuit path are typically used (i.e., an unrealistically large difference between early and late mode timing values is used). Such pessimistic evaluations of the delay in circuit paths may lead to overdesigned circuits.

SUMMARY OF THE INVENTION

One aspect of the invention relates to a method for analyzing the timing of a circuit. The method comprises determining at least one location information for one or more inputs to a timing test and computing a timing slack for the timing test using the at least one location information.

Another aspect of the invention relates to a computer-readable medium containing instructions. When executed, the instructions cause the computer to determine at least one location information for one or more inputs to a timing test and a timing slack for the timing test using the at least one location information.

A further aspect of the invention relates to a method of analyzing the timing of an integrated circuit. The method comprises identifying an early path and a late path in the integrated circuit. The method also comprises determining a timing slack variation in the early path using location information on one or more elements in the early path and determining a timing slack variation in the late path using location information on one or more elements in the late path, and computing a new timing slack for the early path and the late path by using the timing slack variation in the early path and the timing slack variation in the late path.

BRIEF DESCRIPTION OF THE DRAWINGS

The invention will be described with respect to the following drawing figures, in which like numerals represent like elements throughout the views, and in which.

DETAILED DESCRIPTION OF EMBODIMENTS OF THE INVENTION

In general, the invention provides systems and methods for more accurately predicting the delay in circuit paths by considering the portion of delay that is influenced by the proximity of circuit elements in a path or paths separately from the full delay distribution. Methods according to the invention may be embodied in systems and software programs for delay analysis, and may be used to improve the design of circuits and circuit paths or to identify the cause of timing failures in existing circuits.

Figure 1:
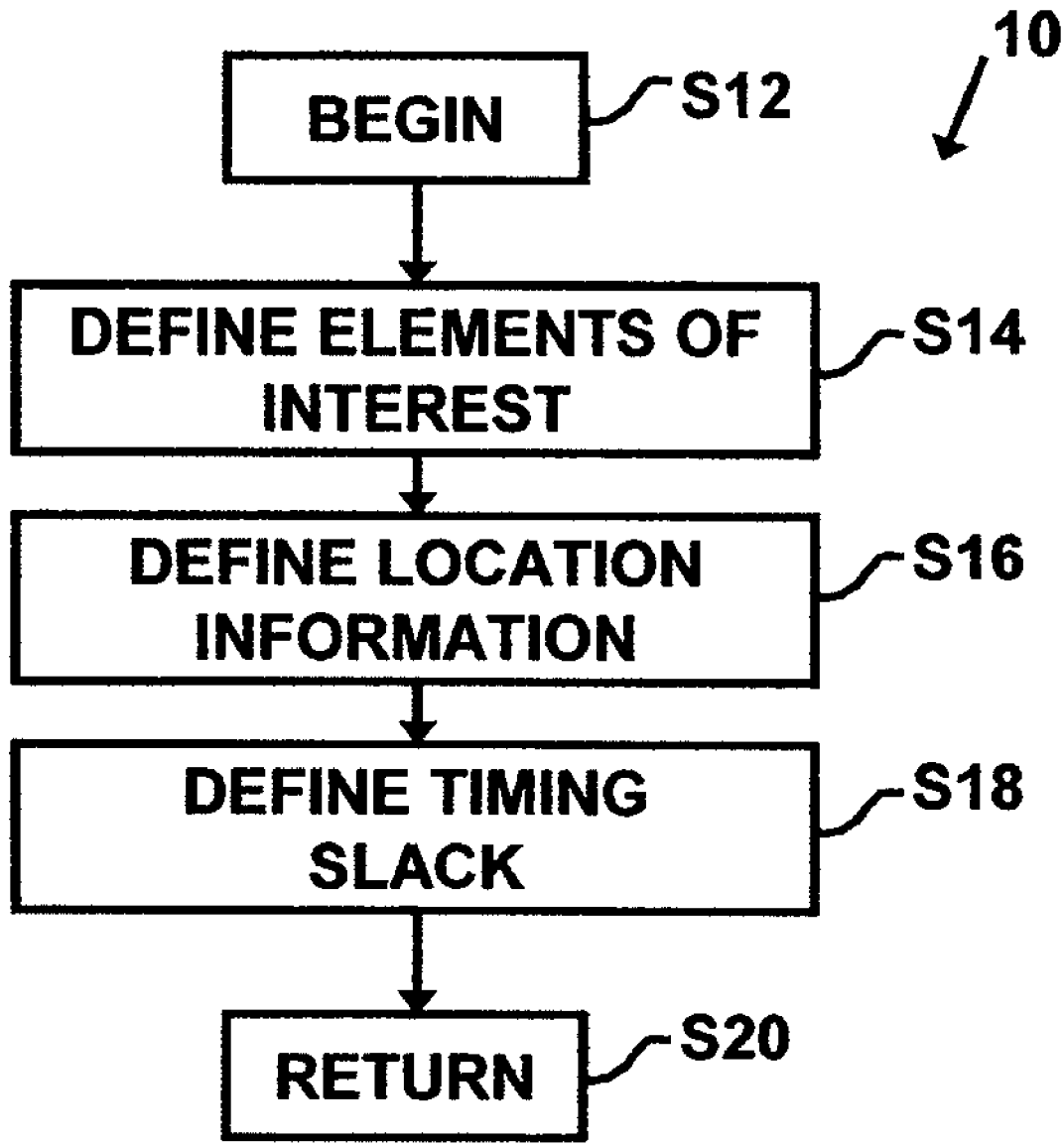
FIG. 1 is a schematic flow diagram of a method according to embodiments of the invention.

FIG. 1 is a schematic flow diagram of a method 10 according to an embodiment of the invention for analyzing the timing of a circuit. The circuit analyzed in method 10, and in other methods according to the invention, may be a circuit or integrated circuit of any type or function and, in particular, may be an existing integrated circuit or a newly-designed integrated circuit.

Method 10 begins at S12, and continues at S14. At S14, the user defines the cells or elements that are of interest for a particular timing test or evaluation. These cells or elements may be considered in terms of paths (i.e., the chain of gates through which the earliest or latest signal can pass) or logic cones (i.e., the entire set of gates which converge on a timing test). Cells and elements of interest may include, for example, the metal wires of connection gates, the transistors of the gates, or any other structures affecting the generation and propagation of signals in the circuit. In general, cells or elements of interest may be considered, individually or collectively, to be inputs to a timing test. Once the cells or elements of interest are defined, method 10 continues with S16.

At S16, the user defines location information for the cells or elements of interest that were defined in S14. Location information may refer to the physical location of a particular element in a circuit layout relative to another, in which case the location information may be expressed in terms of a conventional coordinate system, such as the Cartesian coordinate system. However, the term "location," as used herein, should not be construed as being limited to indicia of physical location in a circuit layout. In addition to indicia of physical location, abstract spaces that describe location may be defined by considering factors other than physical location.

For example, an abstract location space and, therefore, the distance between two elements, may be defined by the similarity between the two elements. As one example, gates of the same or similar design would typically have closely correlated delay distributions, and might be considered close together based on the difference between their delay distributions. However, gates of different design (e.g., pass gate circuits and complementary CMOS circuits) may have little delay correlation, and may be considered far apart based on the difference between their delay distributions. In embodiments of the invention, both abstract location and physical location may be taken into account by defining an appropriate abstract space that includes information on physical location.

Once location information is defined in S16, method 10 continues and the timing slack for the paths or elements defined in S12 is calculated at S18, taking into account the location information defined in S16. Timing slack may be calculated as the difference in arrival times between an early and a late path in a particular test, although the particular calculations to determine timing slack for a particular circuit or test may vary and can be determined by those skilled in the art. Timing slack is typically defined so that a negative slack indicates a violation of a timing constraint, and a positive value indicates the margin by which a timing constraint is met. In typical methods according to embodiments of the invention, the location information defined in S16 would be used to calculate a timing slack variation based on the location information, and the timing slack variation would be added to the typical, unadjusted timing slack for the racing paths or logic cone to determine a new, adjusted timing slack which is less pessimistic.

Once the timing slack has been determined in S18, the method 10 returns at S20. However, method 10 may be implemented in software or other tools for STA, in which case it may be used iteratively, or other tasks related to method 10 may be performed. For example, method 10 could be embodied, at least in part, in an STA analysis program or utility such as EinsTimer (IBM Corporation, Armonk, N.Y.), which may be used in the course of logic editing, logic synthesis and placement tools. If used as a part of placement tools, the results of method 10 may be used to apply design penalties for widely located circuit elements according to layout rules, so as to encourage closely located circuit elements, particularly for paths or logic cones whose delay is important to the function of the circuit as a whole.

As will be understood by those of skill in the art, method 10, and other methods according to the invention, may be implemented on a general purpose computer, a special purpose computer, an ASIC, or any other device having sufficient capabilities to execute the tasks of the methods. Additionally, method 10 and other methods according to the invention may be implemented using a compiled programming language, such as C or C++, an interpreted or scripting language such as Tcl, and other languages, such as Java and J++. Typically, the particular hardware platform and programming language would be chosen so as to complement the hardware and programming languages in which existing STA tools are implemented.

Figure 2:
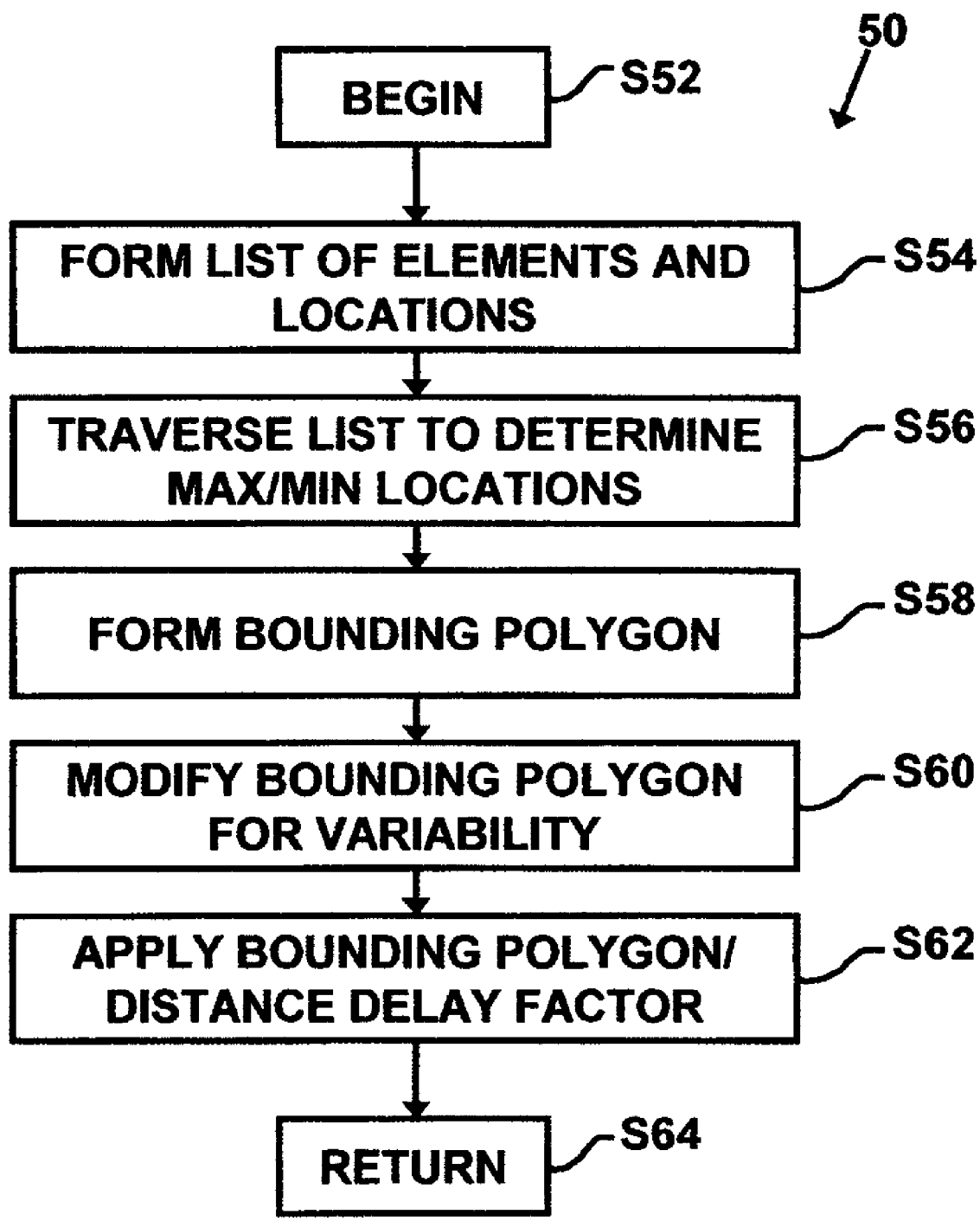
FIG. 2 is a schematic flow diagram of another method according to embodiments of the invention.

Each of the three major tasks S14, S16, S18 defined in method 10 may be implemented in a number of ways. For example, FIG. 2 is a schematic flow diagram of a method 50 according to an embodiment of the invention. Method 50 begins at S52 and continues with S54. At S54, a list is made of all cells or elements in the path or logic cone of interest and their location coordinates. (As was described above, the location coordinates may be physical, abstract, or some combination of physical and abstract.) Method 50 then continues with S56, in which the list of S54 is traversed to find the maximum and minimum location coordinates in the list. For example, if Cartesian coordinates are used for location, S56 would involve finding the minimum and maximum X and Y coordinates. Depending on the particular circuit path, there may be any number of maxima and minima.

Once the maxima and minima are determined, method 50 continues with S58, in which a bounding polygon or region is formed using each set of maxima/minima coordinates as an endpoint. The region may have any number of sides and any number of endpoints. Additionally, it should be understood that while the term "polygon" may be used for convenience in description, the sides or distances between maxima and minima may be of any length and, particularly, may be of irregular lengths.

In some embodiments, particularly those in which method 50 is implemented as part of a software tool with a graphical user interface (GUI), S54-S58 may be performed by, for example, selecting individual elements or groups of elements to define the bounding region or polygon using the features of the GUI. Alternatively, if a GUI is used, the user could select a larger area and the software package could follow S54-S58 to define a bounding region within that larger area.

The bounding region defined in S58 may be used to calculate delays and adjust timing slack without any further tasks and, in that case, method 50 may continue directly with S62. In S62, the delay due to the relative location of elements within a circuit path may be defined using the bounding region or polygon by defining a function that expresses the relationship between the location of two elements and their delay difference. This task will be described in more detail below.

However, if the bounding region defined in S58 is used, the location-based adjustments to the timing slack may be overly pessimistic, because the bounding region may encompass the entire logic cone. For that reason, in embodiments of the invention, method 50 continues with S60, in which the bounding region or polygon is modified to make a more realistic estimate of the location-based adjustments to the timing slack.

Figure 3A:
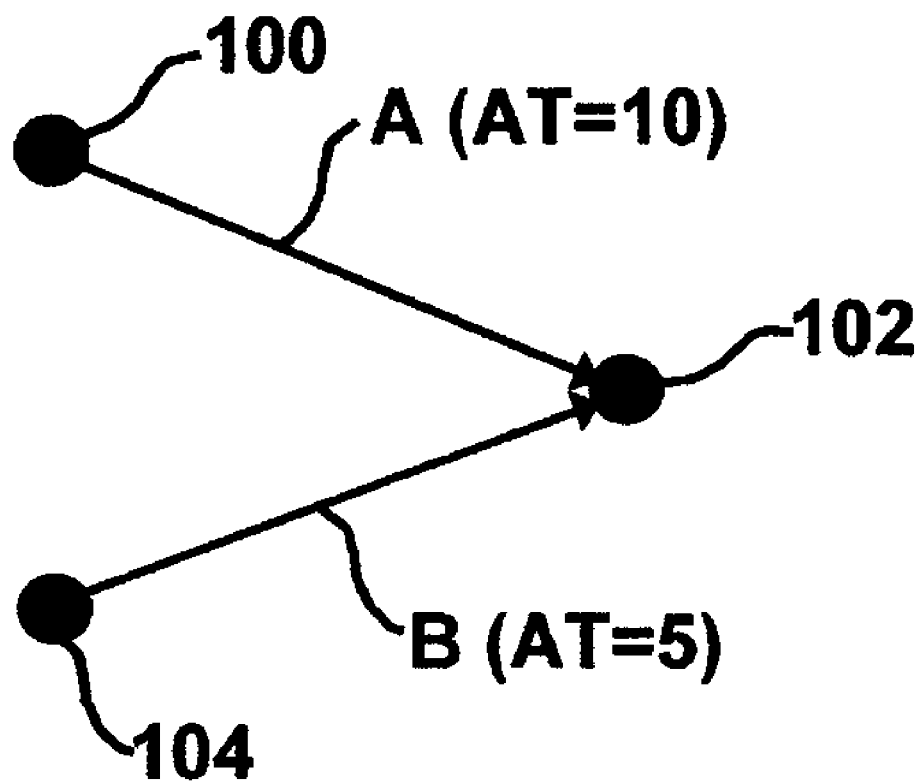
FIG. 3A is a schematic diagram illustrating two paths originating at separate nodes and merging at a node.
Figure 3B:
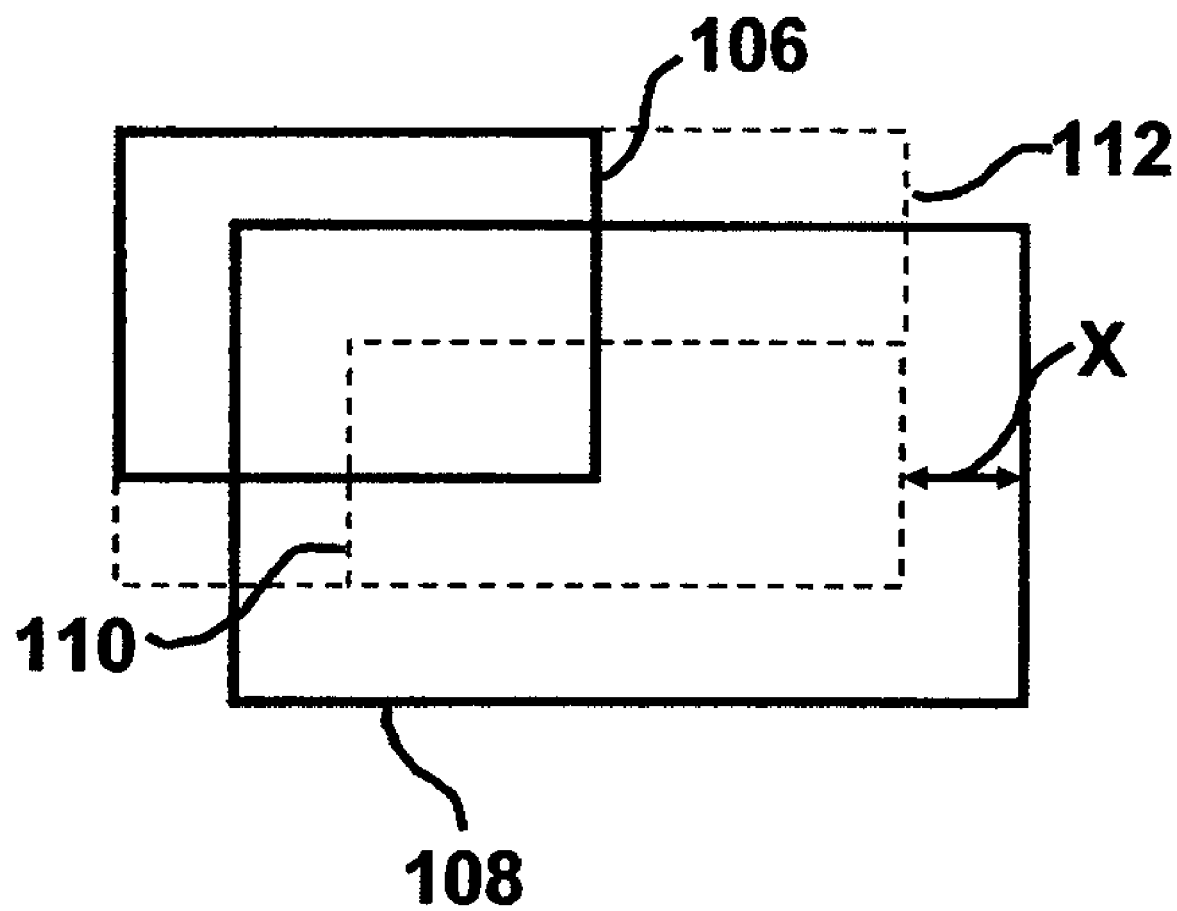
FIG. 3B is a schematic diagram illustrating the concept of varying the dimensions of a bounding region, as applied to the paths illustrated in FIG. 3A.

FIGS. 3A and 3B are schematic diagrams illustrating the basic concept of modifying the bounding region. FIG. 3A illustrates a path A, which originates from a node or cell 100 and terminates/merges at a node or cell 102, and a path B, which originates from a node 104 and terminates/merges with path A at node or cell 102. As an example, path A may have an arrival time of 10 and path B may have an arrival time of 5. (For purposes of this conceptual example, units of distance and arrival time are arbitrary.)

FIG. 3B illustrates an appropriate bounding region for path A, indicated by reference numeral 106, and an appropriate bounding region for path B, indicated by reference numeral 108. The two bounding regions 106, 108 encompass the elements or cells in the paths A, B.

Assume that a distance of X between two objects of interest can introduce at most an increased delay difference of D. In the example of FIG. 3A, the arrival time propagated along A is the extreme (e.g., the maximum for late mode), and the arrival time propagated along B is D less than that propagated along A (in the case of FIG. 3A, D=5). Because of this, the bounding shape 108 of path B may be reduced in each dimension by X, as shown in FIG. 3B, to form a reduced B shape 110 before merging the reduced B shape 110 with the bounding shape 106 for path A to form a merged bounding shape 112.

The distance from any point in this merged bounding shape 112 to another point in a bounding shape for the opposite path (e.g., the early path) will still determine a conservative bound on the slack at the test. This can be seen by considering two cases. First, the farthest point in the merged A/B shape 112 may come from the A shape 106. Because the A shape 106 bounds the locations of objects of interest feeding A, a delay variation DV computed from it will also bound the delay variation of the difference between the early path arrival time and the late path arrival along A. Second, the farthest point in the merged A/B shape 112 may come from the reduced B shape 110. Because the selected point is the furthest point from the early path of any in the merged A/B shape 112, no object of interest in the B path may be more than X farther from the early path than this selected point. Therefore, the delay variation between an object in path B and one in the early mode path will be at most DV+D. However, since the nominal arrival time along A is already D greater than that along B, adding D to the variation of B cannot create a worse slack at the test.

The reduction of S60 that was explained above may be performed on both early and late paths at every point where multiple delay edges converge, where the shape for the non-dominant edges (the edges which do not produce the maximum arrival time in late mode, or the minimum arrival time in early mode) are reduced. The reduction distance (the shrinkage factor) is determined by the cumulative delay along the path to the point, and the difference in arrival time from the dominant arrival time. The cumulative delay influences the reduction distance because delay variation is a fraction of total delay, and so the reduction distance for a sub-cone with a large cumulative delay will be smaller for a given delta arrival time than for a sub-cone with a small cumulative delay.

The tasks of S60 may be represented by a set of mathematical equations and relationships, which may facilitate computerized or other automated implementation of methods according to the invention. With respect to FIG. 3A, the two nodes of interest, 100 and 104, have outgoing timing edges A and B, respectively, both of which terminate on 102, and the late mode bounding regions and arrival times for 100 and 104 (without considering variation) may be defined as Lbox(100), Lbox(104), LAT(100), and LAT(104) (with "AT" denoting "arrival time"). (Of course, the equations and relationships may be defined with respect to any nodes of interest; reference numerals from FIG. 3A are used only for convenience in description.) The maximum late mode delays of edges A and B (without considering variation) may be defined as Ld(A) and Ld(B). By STA:

$$LAT(102)=\max(LAT(100)+Ld(A),LAT(104)+Ld(B)) \quad (1)$$

Or, in other words, the arrival time of 104 is the maximum of either the arrival time of 100 plus the maximum late mode delay of edge A or the arrival time of 104 plus the maximum late mode delay of edge B. For purposes of this example, assume that the LAT(100)+Ld(A) term of Equation (1) is the larger of the two terms. With that assumption, a function Ldiff may be defined as:

$$Ldiff=LAT(100)+Ld(A)-(LAT(104)+Ld(B)) \quad (2)$$

A function may also be defined to relate distance to delay. For example, a function may be defined such that elements at the same location would have a 0% delay difference, elements separated by 1 mm or less would have a 3% delay difference, elements separated by 2 mm or less would have a 5% delay difference, and so forth. The data used to define the distance-delay function may be gathered empirically or estimated, and the type of distance-delay function may vary among embodiments of the invention. For purposes of this description, the distance-delay function described above may be called var (d). Additionally, a function var_inv(p) is defined as the inverse of the function var(d) (i.e., var_inv(p) maps a percentage delay difference to a distance), a variation in the bounding box or region may be calculated.

Because, in this example, the LAT(100)+Ld(A) term of Equation (1) is the greater of the two terms, Lbox(104) can be reduced. To calculate the area reduction distance for Lbox (104), Equation (3) may be used:

$$reduction(104)=var\_inv(p) \quad (3)$$

In which the variable p is defined by Equation (4):

$$p=Ldiff/(LAT(104)+Ld(B)) \quad (4)$$

Using Equations (3) and (4), Lbox(104) is shrunk by reduction(104) by adding reduction(104) to the left edge X coordinate and bottom edge Y coordinate, and subtracting reduction(104) from the right edge X coordinate and the top edge Y coordinate. Finally, to generate a new bounding region, the union of Lbox(100), Lbox_reduced(104), and the region enclosing 102 is taken. (Optionally, the output net of 102 may also be included in the union.) To do this, a new bounding region is computed in which, for example, the left edge X coordinate and bottom edge Y coordinate are the minima of those of the regions included in the union and the right edge X coordinate and bottom edge Y coordinate are the maxima of those of the regions included in the union.

With the calculations described above, it is possible that an area reduction may cause Lbox_reduced(104), or another bounding region for a non-dominant path, to have a negative extent (e.g., have a left edge X coordinate greater than its right edge X coordinate, or a bottom edge Y coordinate greater than its top edge Y coordinate). This is acceptable, and the union calculations described above can still be performed. Because neither the bounding box for the path or the box for the cell on which the paths are converging (in this case 102) nor that for the dominant path (in this case the path from 100) can have negative extent, it follows that the extent of Lbox(102) generated via the union operation cannot be negative.

The calculations are essentially the same for the early mode analysis. For early mode analysis, the early mode bounding regions and arrival times for 100 and 104 (without considering variation) may be defined as Ebox(100), Ebox(104), EAT(100), and EAT(104), and the minimum (early mode) delays of edges A and B (without considering variation) be Ed(A) and Ed(B). By STA:

$$EAT(102)=\min(EAT(100)+Ed(A),EAT(104)+Ed(B)) \quad (5)$$

Without loss of generality, assume that $$EAT(100)+Ed(A)>EAT(104)+Ed(B) \quad (6)$$

and that $$Ediff=EAT(100)+Ed(A)-(EAT(104)+Ed(B)) \quad (7)$$

The reduction process is then the same for early mode analysis as it is for late mode analysis, and EBox(100), being the noncritical or non-dominant path, is reduced by var_inv (Ediff/(EAT(100)+Ed(A))).

Once the bounding region is modified for variability in S60, method 50 continues with S62, in which a distance-delay function is defined to convert from units of distance to units of delay. For example, the functions var(d) and var_inv (p), which were defined above, may be used to relate distance to delay once the appropriate bounding regions are calculated, so that a timing slack variation can be calculated. The timing slack variation would typically be added to the original timing slack for the paths. Once an improved timing slack is calculated, method 50 terminates and returns.

Method 50 provides one way to evaluate the location-based delays in a circuit. However, methods according to the invention need not perform the precise tasks of method 50. For example, in S54 and S56 of method 50, elements of interest may be defined by traversing a list that includes the location coordinates of each element. Alternatively, elements of interest could be defined, for example, by a method of beginning at one element or node in a circuit and traversing the paths leading to and emanating from that element or node.

Figure 4:
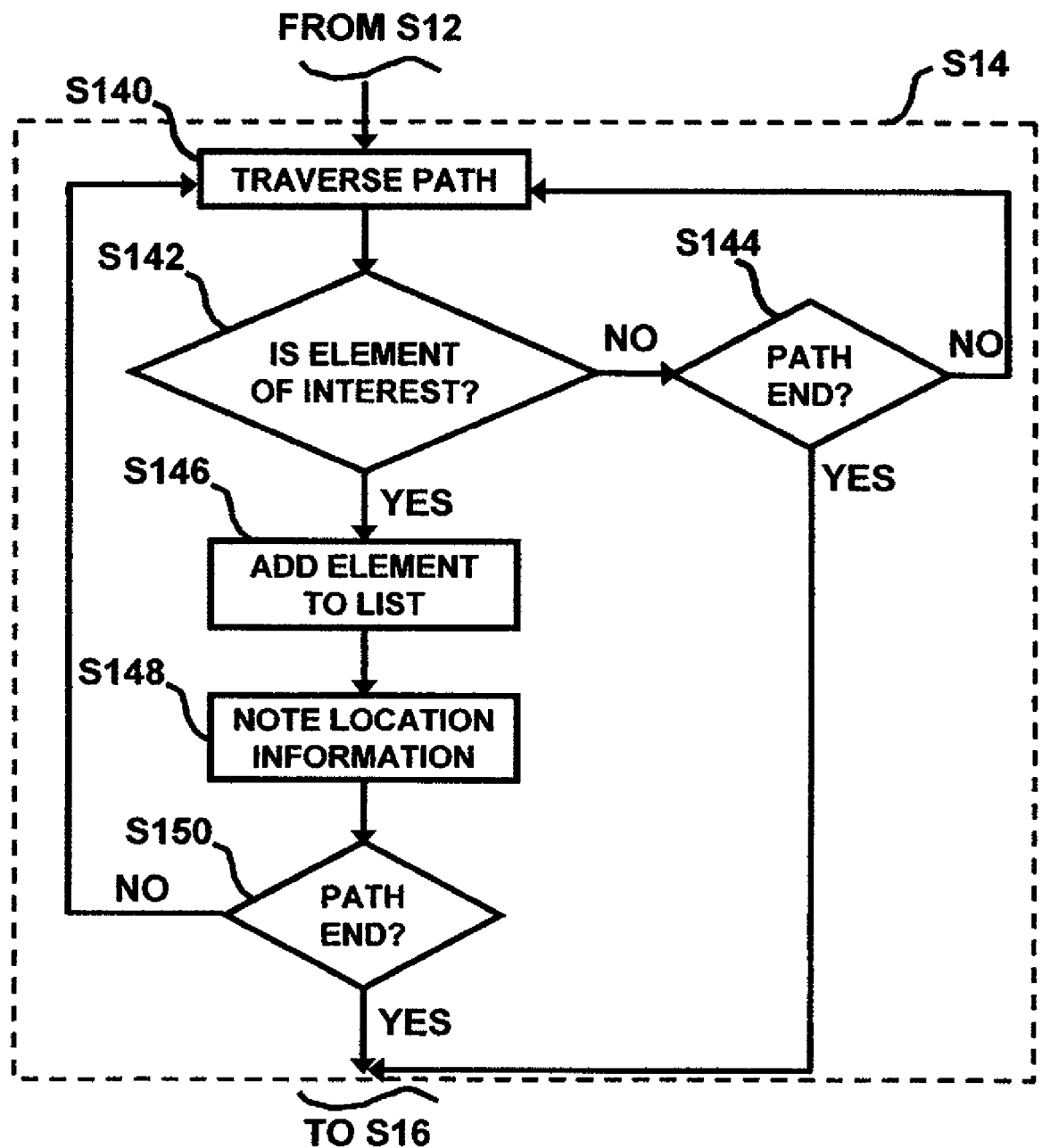
FIG. 4 is a schematic flow diagram illustrating a method for performing certain tasks illustrated in the flow diagram of FIG. 1.

FIG. 4 is a schematic flow diagram of an alternative method for defining elements of interest (i.e., S14 of method 10), shown with respect to the tasks of method 10. However, it should also be understood that the tasks illustrated in FIG. 4 may replace S54-S58 of method 50. The tasks illustrated in FIG. 4 begin when control is transferred from S12 of method 10.

The first task illustrated in FIG. 4 is S140, in which either a user or an automated algorithm begins at a particular node and traverses a path leading to or emanating from that element or node. Although the remaining tasks illustrated in FIG. 4 will be described with respect to a single path, multiple paths may be traced simultaneously or in parallel, limited only by the ability of the user or algorithm to do so. As each element in the path is encountered, control passes to a decision task, S142, in which the user or algorithm decides whether an element encountered in the path is of interest for timing analysis purposes. An element would be of interest, for example, if it is part of the path or paths that are to be analyzed. An element may also be of interest if it feeds or leads into a path that is part of a path or paths that are to be analyzed. However, in methods according to the invention, limits may be set on how many secondary or feeding paths are included in the bounding region. An element would typically be considered to be of interest if it is on at least one path which fails to meet a timing constraint (e.g., has a negative slack) according to a conventional static timing analysis. For other elements, the pessimism involved in a conventional static timing analysis may be less important, since the paths on which they appear will meet their timing constraints even without elimination of this pessimism. An element may be also of interest if its delay is highly dependent on a parameter which is known to have significant spatial correlation. Such high dependence might be identified, for example, by determining whether the magnitude of the derivative of the delay of the element with respect to a parameter value exceeds some threshold.

If the determination is made in S142 that an element is of interest (S142:YES), control passes to S146, in which the element is added to a list of elements that are of interest, before passing to S148, in which the location of the element is noted. The location noted in S148 may be the physical location of the element in the circuit (e.g., in X and Y coordinates), looked up, for example, in a database containing location information for each element or calculated from the starting node plus the path distance traversed. Alternatively, as described above, the location noted in S148 may be an abstract location calculated by examining one or more of characteristics of the element, such as the type of circuit (e.g., pass gate, static CMOS, dynamic), characteristics of the element (e.g., the stack height, of number of series transistors in the function), the delay function of the element (e.g., the parameters on which the delay depends and the sensitivity of the delay to each parameter), or other considerations, either with or without also considering the physical location. The path tracing involved in selecting the elements of interest may also be performed separately from the actual selection, as part of a conventional static timing analysis in which slack values are determined for each element in an integrated circuit. Selection of elements of interest in this case may simply comprise selecting elements whose conventionally computed slack is less than some threshold.

If the determination is made in S142 that an element encountered in the path is not of interest (S142:NO), control passes to S144, a decision task, in which the user or algorithm decides whether the end of the path has been reached. If the end of the path has been reached (S144:YES), control passes out of the tasks illustrated in FIG. 4, for example, into S16 of method 10 or S60 of method 50, depending on the particular method that is implemented. If the end of the path has not been reached (S144:NO), control returns to S140 and the user or algorithm continues to traverse the path. S150, to which control passes from S148, is a decision task identical to S144, and branches in the same ways as S144.

In the methods and description above, location information was considered for each individual element or cell in a path or logic cone. However, in embodiments of the invention, location of elements or cells in a path or logic cone may be considered in the aggregate, instead of individually.

Figure 5:
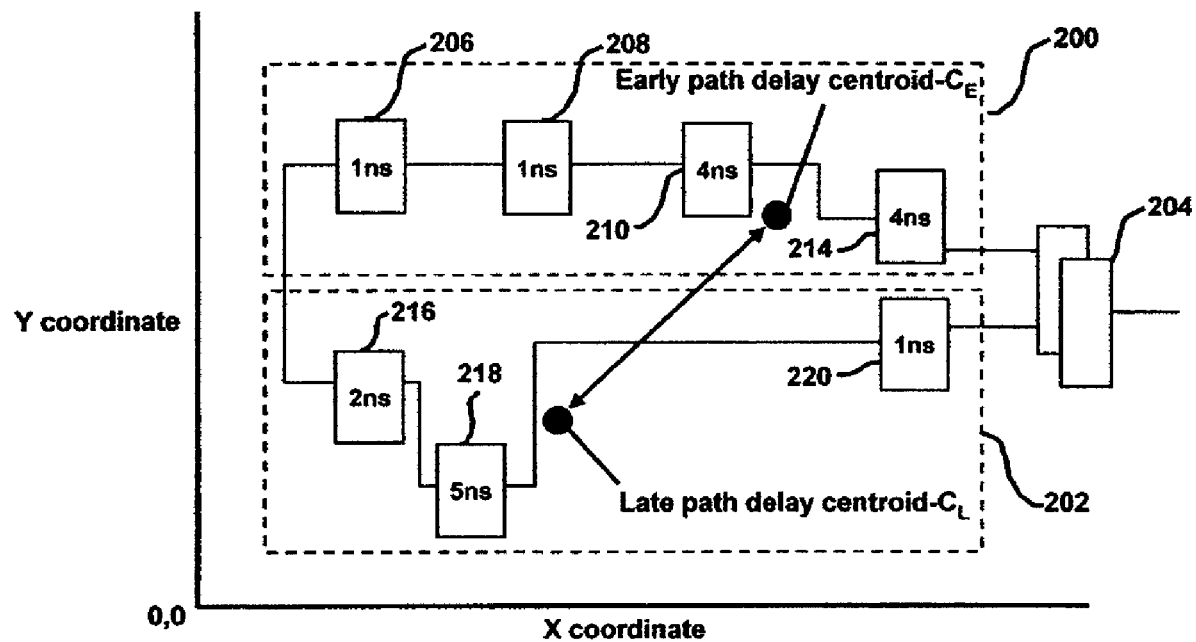
FIG. 5 is a schematic diagram illustrating two paths and a method of considering location information of elements in the paths in the aggregate according to embodiments of the invention.

FIG. 5 is a schematic diagram illustrating a method of considering location information in the aggregate. In FIG. 5, an early path 200 and a late path 202 are shown schematically, laid out on a Cartesian coordinate plane with an origin at (0,0). The early and late paths 200, 202, merge at a latch 204 or other element. The early path 200 includes elements or cells 206, 208, 210, and 214; the late path 202 includes elements 216, 218, and 220. Each element 206-220 has its own unique location in the circuit, as shown in FIG. 5, and each element 206-220 has some characteristic delay. In this example, elements 206, 208, and 220 have delays of 1 ns, element 214 has a delay of 4 ns, and elements 216 and 218 have delays of 2 ns, 5 ns, respectively. The delays shown in FIG. 5 are for illustrative purposes; in general, delays considered may include individual cell delays alone, or cell delay plus the wire delay of the cell's output net.

Based on the locations of each cell or element in the paths 200, 202 and, optionally, their delays, a centroid or "delay center of gravity" is calculated for each one of the paths individually. FIG. 5 shows the two centroids, including the centroid for the early path $C_E$ and the centroid for the late path $C_L$. The distance D between the two centroids $C_E$, $C_L$ and, optionally, the standard deviations of the centroid locations, may be used to calculate a timing slack variation, for example, by using the type of distance-delay functions described above with respect to method 50.

The centroids may be calculated in a variety of ways. In one method of calculating a centroid, the location coordinates of each element in a path would simply be averaged. However, as was described above, the cell delay or some combination of cell and wire delay may also be taken into account for each cell or element. For example, if the X coordinate, Y coordinate, and delay of a cell or element were to be represented by the variables $x_i$, $y_i$, and $d_i$, respectively, then the X and Y coordinates of the delay-weighted centroid, denoted by $C_x$ and $C_y$, could be calculated as in Equations (8) and (9):

$$C_x = \frac{\sum_i (x_i \times d_i)}{\sum_i d_i} \quad (8)$$

$$C_y = \frac{\sum_i (y_i \times d_i)}{\sum_i d_i} \quad (9)$$

As those of skill in the art will realize, a cell or element consumes some non-zero amount of space itself. Therefore, in methods according to the invention, the location coordinates of a cell or element may be the coordinates for the center of the cell. Since most cells or elements are rectangular, this location is unambiguous for most cells. For non-rectangular cells, the cell center could be considered to be the center of the minimum size axis-aligned rectangular bounding box which completely encloses the cell. In general, the center of the cells or elements in a path or logic cone may be defined in any desired way, as long as usage is consistent among multiple cells or elements, or any inconsistencies are taken into account.

The centroid calculations described above and with respect to FIG. 5 are only one way in which aggregate and average location information may be used in methods according to embodiments of the invention. Other methods of using aggregate and average location information may be used in methods according to embodiments of the invention.

While the invention has been described with respect to certain exemplary embodiments, those of skill in the art will realize that modifications and variations are possible within the scope of the appended claims.

What is claimed is:

1. A method for analyzing the timing of a circuit, comprising:
   determining at least one location information for one or more inputs to a timing test;
   computing a timing slack variation for the timing test using the at least one location information; and
   one of:
   designing the circuit based on the analysis of the timing; and
   identifying the cause of timing failures in an existing circuit,
   wherein the one or more inputs comprise cells or elements of interest,
   wherein the method predicts a delay in circuit paths by considering a portion of the delay that is influenced by a proximity of circuit elements in a path or paths separately from a full delay distribution, and
   wherein the at least one location information refers to a physical location of a particular element in a circuit layout relative to another element in the circuit layout or relative to a coordinate system.

2. The method of claim 1, wherein the input to a timing test is a path or a logic cone.

3. The method of claim 1, wherein the at least one location information comprises a bounding region for the one or more inputs to the timing test.

4. The method of claim 3, wherein said determining comprises defining the bounding region based on the locations of the one or more inputs to the timing test.

5. The method of claim 4, wherein said determining further comprises modifying a size of the bounding region to account for variations in delay among the one or more inputs to the timing test.

6. The method of claim 5, wherein said computing comprises:
   determining a slack variation factor based on the size of the bounding region; and
   adding the slack variation factor to a timing slack calculated for the one or more inputs to the timing test.

7. A method for analyzing the timing of a circuit, comprising:
   determining at least one location information for one or more inputs to a timing test;
   computing a timing slack for the timing test using the at least one location information; and
   one of:
   designing the circuit based on the analysis of the timing; and
   identifying the cause of timing failures in an existing circuit,
   wherein the at least one location information comprises a centroid of the one or more inputs to the timing test, and
   wherein the at least one location information refers to a physical location of a particular element in a circuit layout relative to a coordinate system.

8. The method of claim 7, wherein the centroid comprises the averaged location of the one or more inputs to the timing test.

9. The method of claim 7, wherein the centroid comprises the delay-weighted averaged location of the one or more inputs to the timing test.

10. The method of claim 7, wherein said determining comprises:
    determining the distance between centroids.

11. The method of claim 10, wherein said calculating comprises:
    determining a slack variation factor based on the distance between the centroids; and
    adding the slack variation factor to a timing slack calculated for the one or more inputs to the timing test.

12. The method of claim 7, wherein the at least one location information comprises an abstract location information.

13. The method of claim 12, wherein the abstract location information is based upon correlation of delay functions.

14. A computer-readable medium containing instructions that, when executed, cause a computer to:
  determine at least one location information for one or more inputs to a timing test;
  compute a timing slack variation for the timing test using the at least one location information; and
  one of:
    design a circuit; and
    identify the cause of timing failures in an existing circuit,
  wherein the one or more inputs comprise cells or elements of interest,
  wherein the at least one location information refers to a physical location of a particular element in a circuit layout relative to another element in the circuit layout, and
  wherein the method predicts a delay in circuit paths by considering a portion of the delay that is influenced by a proximity of circuit elements in a path or paths separately from a full delay distribution.

15. The medium of claim 14, wherein the input to a timing test is a path or a logic cone.

16. The medium of claim 14, wherein the at least one location information comprises a bounding region for the one or more inputs to the timing test.

17. The medium of claim 16, wherein said determining comprises defining the bounding region based on the locations of the one or more inputs to the timing test.

18. The medium of claim 17, wherein said determining further comprises modifying a size of the bounding region to account for variations in delay among the one or more inputs to the timing test.

19. The medium of claim 18, wherein said computing comprises:
  determining a slack variation factor based on the size of the bounding region; and
  adding the slack variation factor to a timing slack calculated for the one or more inputs to the timing test.

20. A computer-readable medium containing instructions that, when executed, cause a computer to:
  determine at least one location information for one or more inputs to a timing test;
  compute a timing slack for the timing test using the at least one location information; and
  one of:
    design a circuit; and
    identify the cause of timing failures in an existing circuit,
  wherein the at least one location information comprises a centroid of the one or more inputs to the timing test, and
  wherein the at least one location information refers to a physical location of a particular element in a circuit layout relative to a coordinate system.

21. The medium of claim 20, wherein the centroid comprises the averaged location of the one or more inputs to the timing test.

22. The medium of claim 20, wherein the centroid comprises the delay-weighted averaged location of the one or more inputs to the timing test.

23. The medium of claim 20, wherein said determining comprises:
  determining the distance between centroids.

24. The medium of claim 23, wherein said computing comprises:
  determining a slack variation factor based on the distance between the centroids; and
  adding the slack variation factor to a timing slack calculated for the one or more inputs to the timing test.

25. The medium of claim 20, wherein the at least one location information comprises an abstract location information.

26. The medium of claim 25, wherein the abstract location information is based upon correlation of delay functions.

27. A method of analyzing the timing of an integrated circuit, comprising:
  identifying an early path and a late path in the integrated circuit;
  determining a timing slack variation in the early path using location information on one or more elements in the early path;
  determining a timing slack variation in the late path using location information on one or more elements in the late path;
  computing a new timing slack for the early path and the late path by using the timing slack variation in the early path and the timing slack variation in the late path; and
  one of:
    designing the integrated circuit based on the analysis of the timing; and
    identifying the cause of timing failures in an existing circuit,
  wherein the location information refers to physical location of a particular element in a circuit layout relative to another element in the circuit layout or relative to a coordinate system.

28. The method of claim 27, wherein the location information on the one or more elements in the early path and the location information on the one or more elements in the late path comprise bounding regions defined around the one or more elements in the early path and the one or more elements in the late path, respectively.

29. The method of claim 27, wherein the location information on the one or more elements in the early path and the location information on the one or more elements in the late path comprise centroids calculated by considering the one or more elements in the early path and the one or more elements in the late path, respectively, as aggregates.

30. The method of claim 27, wherein the method is performed for an early mode timing analysis of the integrated circuit and a late mode timing analysis of the integrated circuit.

31. The medium of claim 27, wherein a delay in circuit paths is predicted by considering a portion of the delay that is influenced by a proximity of circuit elements in a path or paths separately from a full delay distribution.

* * * * *